United States Patent [19]

Chaffin, III et al.

[11] 4,040,927
[45] Aug. 9, 1977

[54] CADMIUM TELLURITE THIN FILMS

[75] Inventors: John H. Chaffin, III, Minnetonka;
Richard A. Skogman, Inver Grove Heights, both of Minn.

[73] Assignee: Honeywell Inc., Minneapolis, Minn.

[21] Appl. No.: 633,532

[22] Filed: Nov. 19, 1975

[51] Int. Cl.$^2$ ............................................ C23C 15/00
[52] U.S. Cl. .......................... 204/192 S; 204/192 D; 204/192 P; 252/63.5; 423/508
[58] Field of Search ....................... 423/508, 489, 490; 252/63.5; 204/192 ID, 162 P, 162 S

[56] References Cited

U.S. PATENT DOCUMENTS

| | | | |
|---|---|---|---|
| 3,012,899 | 12/1961 | Giordano | 423/508 X |
| 3,206,279 | 9/1965 | Carnall, Jr. | 423/489 X |

*Primary Examiner*—Leland A. Sebastian
*Attorney, Agent, or Firm*—Omund R. Dahle

[57] ABSTRACT

Cadmium tellurite with a composition $CdTeO_3$ is formed by reactive sputtering of a cadmium telluride target in an oxygen atmosphere.

4 Claims, No Drawings

CADMIUM TELLURITE THIN FILMS

BACKGROUND OF THE INVENTION

The present invention is concerned with the formation of cadmium-tellurium-oxygen compounds. In particular, the present invention is concerned with the preparation of thin films of cadmium tellurite.

In U.S. Pat. No. 3,702,888 by Michael J. Redman, there is disclosed tellurites of the composition $MTe_2O_5$ where M is selected from cadmium, strontium, or calcium. These tellurites are in the form of mica-like plates.

SUMMARY OF THE INVENTION

The present invention is a new cadmium tellurite having an essentially equi-atomic ratio of cadmium-to-tellurium. Layers of this material are deposited on a substrate by reactive sputtering from a cadmium telluride target in an oxygen atmosphere.

DETAILED DESCRIPTION OF THE PREFERRED EMBODIMENTS

In the present invention, thin films of a cadmium-tellurium-oxygen compound are deposited on a substrate by sputtering from a cadmium telluride (CdTe) target in an oxygen atmosphere at a pressure of between about $2 \times 10^{-3}$ and about $2 \times 10^{-2}$ torr. Glass substrates and mercury cadmium telluride substrates have been used. In the preferred embodiments, the substrate is maintained at ambient temperature and the oxygen pressure is about $1.5 \times 10^{-2}$ torr. The preferred RF power input for the sputtering apparatus is about 150 watts.

The resulting thin film is very transparent and nearly colorless. The layer is an oxide of cadmium telluride since reactive oxygen sputtering generally results in a stable oxide of the target material being deposited. By contrast, CdTe sputtered in an argon atmosphere produces a metallic looking deposit as opposed to the transparent coating deposited by sputtering CdTe in a pure oxygen atmosphere.

The deposited material was identified as $CdTeO_3$ by comparing the cadmium to tellurium ratio of a single crystal CdTe sample and the transparent deposit. The ratios, which were determined using x-ray methods, were found to be essentially equal. The only stable cadmium-tellurium-oxygen compound which can be formed with an equi-atomic cadmium-to-tellurium ratio is $CdTeO_3$.

The thin films of the present invention have several potential applications. First, because of the transparency of the material, the thin films may be used as optical coatings.

Second, it has been found that the cadmium tellurite thin films are insulating and are wetted by indium. Cadmium tellurite thin films, therefore, may be used as an insulating layer between a mercury cadmium telluride photoconductive device and an electrically conductive substrate. This application of cadmium tellurite thin films is discussed in further detail in the co-pending patent application by J.H. Chaffin, III, entitled "Photodetector-to-Substrate Bonds" Ser. No. 633,531 which was filed on even date with this application and is assigned to the same assignee now U.S. Pat. No. 3,996,548.

Third, tests have indicated that the thin films of the present invention exhibit a strong Ovshinsky effect. The present invention, therefore, may have applications for Ovshinsky effect devices.

In conclusion, the present invention is a new material, $CdTeO_3$, and a novel way of preparing this material. Although the present invention has been described with reference to preferred embodiments, workers skilled in the art may recognize that changes may be made in form and detail without departing from the spirit and scope of the present invention.

The embodiments of the invention in which an exclusive property or right is claimed are defined as follows:

1. A method of depositing a layer of a cadmium-tellurium-oxygen compound, the method comprising:
   providing a substrate; and
   sputter depositing the cadmium-tellurium-oxygen compound onto the substrate by sputter depositing from a cadmium telluride target in an oxygen atmosphere.

2. The method of claim 1 wherein the oxygen atmosphere has a pressure of between about $2 \times 10^{-3}$ torr and about $2 \times 10^{-2}$ torr.

3. The method of claim 1 wherein the cadmium-tellurium- oxygen compound has an essentially equi-atomic ratio of cadmium-to-tellurium.

4. The method of claim 3 wherein the cadmium-tellurium- oxygen compound is $CdTeO_3$.

* * * * *